(12) United States Patent
Brewer et al.

(10) Patent No.: US 7,113,116 B2
(45) Date of Patent: Sep. 26, 2006

(54) SAMPLE AND HOLD APPARATUS

(75) Inventors: Robert J. Brewer, Lambourn (GB); Colin G. Lyden, Baltimore (IE); Michael C. W. Coln, Lexington, MA (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/045,672

(22) Filed: Jan. 26, 2005

(65) Prior Publication Data

US 2006/0164279 A1 Jul. 27, 2006

(51) Int. Cl.
H03M 1/00 (2006.01)
(52) U.S. Cl. ............... 341/122; 341/150; 341/155; 341/172; 327/94; 327/95; 327/96
(58) Field of Classification Search ............ 341/122, 341/172; 327/94
See application file for complete search history.

(56) References Cited

U.S. PATENT DOCUMENTS

| | | | | |
|---|---|---|---|---|
| 4,325,027 A | * | 4/1982 | Dykstra et al. | 324/329 |
| 4,331,894 A | | 5/1982 | Gregorian et al. | |
| 4,511,847 A | * | 4/1985 | Rantala | 327/94 |
| 4,591,832 A | * | 5/1986 | Fling et al. | 341/141 |
| 4,677,422 A | * | 6/1987 | Naito | 341/122 |
| 5,061,865 A | * | 10/1991 | Durst | 327/94 |
| 5,376,841 A | * | 12/1994 | Itakura et al. | 327/94 |
| 5,408,192 A | * | 4/1995 | Bailey | 327/254 |
| 5,698,999 A | * | 12/1997 | Etoh et al. | 327/94 |
| 5,872,470 A | * | 2/1999 | Mallinson et al. | 327/94 |
| 6,529,049 B1 | * | 3/2003 | Erhart et al. | 327/94 |
| 6,636,084 B1 | * | 10/2003 | Sarraj | 327/95 |
| 6,700,417 B1 | * | 3/2004 | Kawahito et al. | 327/94 |
| 2004/0222351 A1 | | 11/2004 | Rossi | |

FOREIGN PATENT DOCUMENTS

| | | |
|---|---|---|
| EP | 0825589 | 2/1998 |
| JP | 04345277 | 12/1992 |
| JP | 06085670 | 3/1994 |

OTHER PUBLICATIONS

PCT/US2002/001940 International Search Report, Apr. 21, 2006.

* cited by examiner

*Primary Examiner*—Rexford Barnie
*Assistant Examiner*—Khai Nguyen
(74) *Attorney, Agent, or Firm*—Wolf, Greenfield & Sacks, P.C.

(57) ABSTRACT

An acquisition and averaging circuit is provided in which, during a sampling phase capacitors in sample blocks 4 and 6 are sequentially connected to the input signal to sample it and are then isolated so as to hold the sample. The capacitors are then connected to a combining/averaging arrangement such that an average of the sample values is formed.

17 Claims, 6 Drawing Sheets

SAMPLE AND HOLD APPARATUS

FIELD OF THE INVENTION

The present invention relates to a method of and apparatus for sampling a signal.

BACKGROUND OF THE INVENTION

It is common for data acquisition systems to perform a conversion between the analog domain and the digital domain. Typically this is performed by sampling the input signal at an instant in time and then holding it whilst an analog to digital conversion process is performed. The idealised sample and hold operation takes an instantaneous "snap shot" of the signal value. Such samples of the input signal will contain an instantaneous noise value added to the signal value. This can affect the accuracy of the conversion from the analog to the digital domain. In order to reduce the effect of noise it is known to take multiple samples of the signal, digitizing each sample and finding an average value mathematically. However this does require a proportionately faster analog to digital converter.

SUMMARY OF THE INVENTION

According to a first aspect of the present invention there is provided a sample and hold apparatus comprising:
  a first sampling arrangement arranged to sample a first input signal during a first sampling period, and to hold a first sample of the first input signal after completion of the first sampling period;
  a second sampling arrangement arranged to sample the first input signal during a second sampling period, and to hold a second sample of the first input signal after completion of the second sampling period; and
  wherein the first and second sampling arrangements are further arranged to output the first and second samples to a combining arrangement during a first output period.

It is thus possible to arrange for multiple sampling arrangements, that is effectively individual sample and hold circuits, to take multiple samples of input signals at different points in time and then for the sample and hold circuits to simultaneously output their sample values in such a way that an analog representation of the average sample value is derived. The average may be a true numerical average with, in the case of an apparatus taking only first and second samples, the average lying between the first and second values. However, it will also be seen that, subject to the introduction of a scaling factor the "average" can also be formed by merely adding the first and second values together. In this case the sum of the first and second values will be, by definition, twice the average value. The analog representation can then be converted to the digital domain by an analog to digital converter which does not have to be as fast as the corresponding converter would need to be in the prior art where multiple samples are taken and digitized, and then averaged in the digital domain.

Advantageously each sampling arrangement comprises a sampling capacitor in association with a plurality of electronically controlled switches.

Considering the switches within a sampling arrangement and associated with a capacitor, advantageously a first switch which may be thought of as a "sampling switch" is provided to connect a first plate of the capacitor to an input signal line during the sampling period of that capacitor, but otherwise to isolate the first plate of the capacitor from the input signal line. A first output switch is provided to connect the first plate of the capacitor to a first output node during the first output period, but otherwise to isolate the first plate of the capacitor from the first output node. In some embodiments of the invention only these two switches are required, and the second plate of the capacitor can be permanently tied to a reference or a ground rail. However in a preferred embodiment of the present invention two further switches are provided. A third switch, which can be thought as a "reference" switch is provided to selectively connect the second plate of the capacitor to a ground or reference line during the period that the sampling switch connects the first plate of the capacitor to the signal input line, but otherwise to isolate the second plate of the capacitor from the ground or reference line. A second output switch may be provided to selectively connect the second plate of the capacitor to a second output node only during the first output period, but otherwise to hold the second plate of the capacitor isolated from the second output node.

In an embodiment having N sampling arrangements designated 1 to N and arranged to take N samples of the signal, then in a first sampling period the sampling switch and reference switch of the first sampling arrangement are closed (placed in a low impedance state) such that the input signal is sampled by the capacitor of the first sampling arrangement. At the end of the first sampling period the sampling and reference switches of the first sampling arrangement are opened (placed in a high impedance state) such that the sampled signal is held on the capacitor. During the second sampling period the sampling and reference switches of the second sampling arrangement are closed so as to sample the input signal onto the capacitor of the second sampling block. These switches are then opened at the end of the second sampling period so as to hold the sampled signal. This process may be repeated until all N sampling arrangements have sampled the signal.

Preferably the sampling periods are discrete. However the sampling periods may "overlap".

Preferably in a first embodiment of the present invention, the capacitors of the first and second (and any further) sampling arrangements are connected in parallel during the first output period such that charge redistribution between the capacitors causes the voltage at the first output node to be an average of the sampled values of the first signals.

Preferably the capacitors have the same value to within a predetermined margin of error. For simplicity the capacitors can be thought of as being single entities, although a manufacturer may choose to build each capacitor out of a plurality of capacitors that could be selectively connected together via electronic switches. The capacitors may have different sizes such that a combination of capacitors could be chosen to achieve a nominal target size. Typically the capacitors might be binary weighted (radix=2) or the capacitors might be weighted with a radix less than 2, thereby giving redundancy in the capacitor weighting scheme to overcome variations due to manufacturing tolerances.

Advantageously the combining arrangement is an averaging arrangement comprising a differential amplifier having an inverting input, a non-inverting input and an output, and the first and second output switches of each sampling arrangement can be operated to place the capacitors in parallel between the output and the inverting input of the differential amplifier.

As noted before third, and indeed further sampling arrangements may also be provided and the sampling arrangements may be operated in sequence such that each takes a sample, and then at the end of the sample sequence their outputs are connected in parallel during the output phase in order to achieve averaging of the input sequences. However other modes of operation are possible and the sampling arrangements may be operated in a cyclic manner in order to form moving averages. Thus, if we take a simple example involving three sample and hold arrangements then at a first sampling period the sample and hold may take a sample of the input signal. At a second sampling period the second sample and hold may take a sample of the input signal. At a third sampling period a third sample and hold may take a sample of the input signal but, simultaneously, the first and second sample and holds can provide their outputs to the averaging circuit in order to output a first average signal. During a fourth sampling period the first sampling circuit can once again be operated to take a sample of the first input signal, but simultaneously the second and third sample and holds may have their outputs connected together in order to derive a second output signal. During the fifth sampling period the second sample and hold is operated so as to take a sample of the input signal whilst the first and third sample and holds have their outputs connected together in order to output a third output signal.

Further sample and hold circuits may be provided to sample second, third and subsequent input signals and hence one buffer amplifier and one analog to digital converter can be used in a multiplexed manner to provide averages of multiple input signals.

Furthermore the sample and hold may be implemented as a single ended, or as a differential device, merely by the inclusion of further sampling arrangements within a second input path which, during the output phase have their capacitors connected in parallel to the non-inverting input of the differential amplifier.

In a further embodiment of the invention the sampling arrangements may be connected in an additive manner. This can be performed either by connecting the capacitors of the sampling arrangements in series or, more preferably, by providing a representation of one of the sampled signals to a non-inverting input of an analog to digital converter and by providing a representation of the other one of the sampled signals to the inverting input of the analog to digital converter, and where one of the representations is inverted. This "differential" approach effectively doubles the signal voltage and is useful for driving a differential analog to digital converter so as to maximise the signal to noise ratio.

BRIEF DESCRIPTION OF THE DRAWINGS

The present invention will further be described by way of example, with reference to the accompanying drawings in which.

DESCRIPTION OF PREFERRED EMBODIMENTS OF THE PRESENT INVENTION

Figure 1:
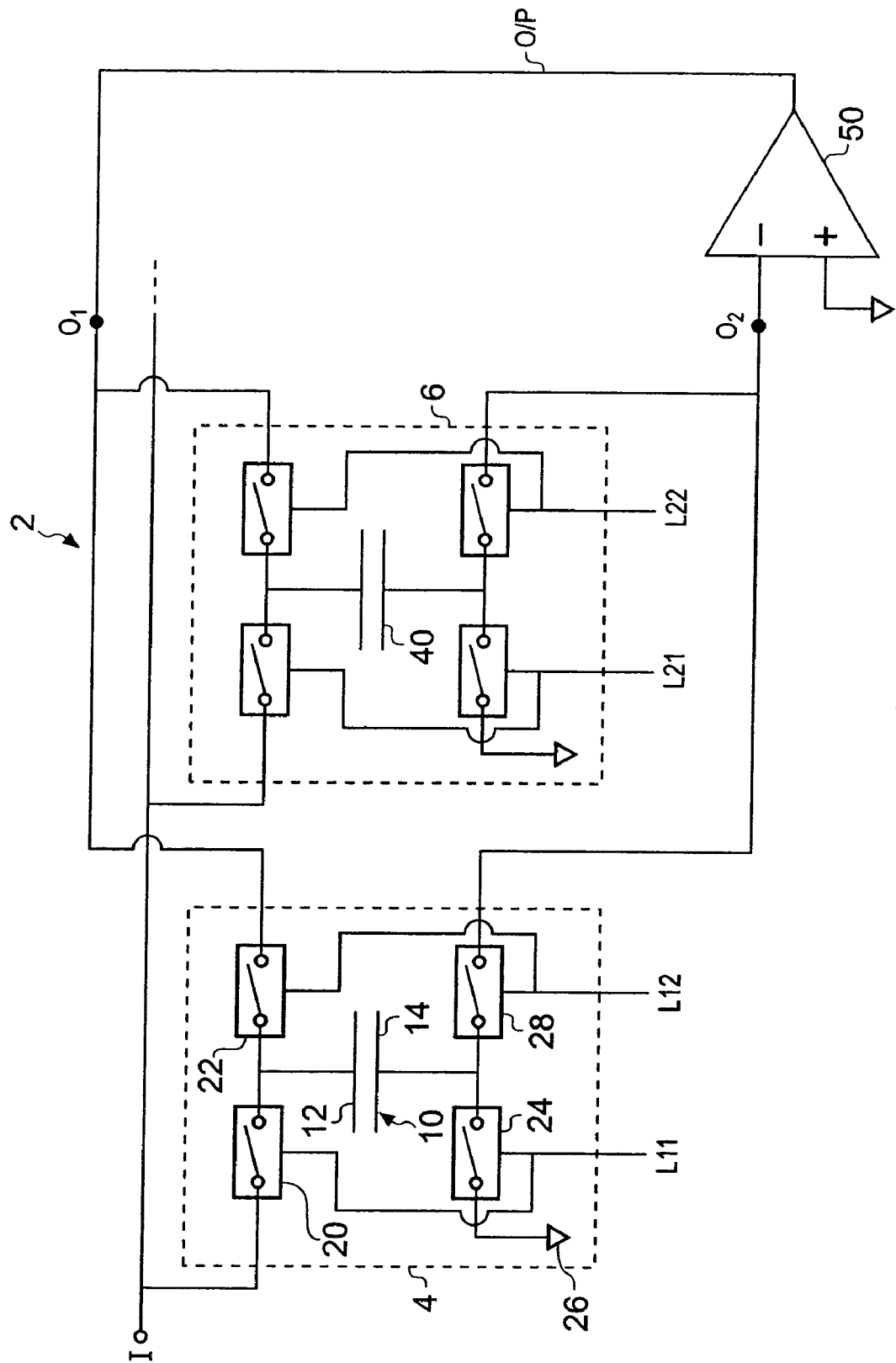
FIG. 1 schematically illustrates a single ended single input sampling arrangement constituting a first embodiment of the present invention.

FIG. 1 is a circuit diagram illustrating a first data acquisition circuit, generally designated 2, constituting an embodiment of the present invention. The circuit has an input node, I, to which an input signal to be sampled and held is applied. A plurality of sampling arrangements, of which two designated 4 and 6 are shown, are connected to the input I. Further sampling arrangements may also be connected to the input I. Each sampling arrangement is the same, and hence for simplicity only the first sampling arrangement 4 will be described in detail. The first sampling arrangement 4 comprises a sampling device implemented as a sampling capacitor 10 having first and second capacitor plates 12 and 14, respectively. A first electronically controlled switch 20 is connected in series between the first capacitor plate 12 and the input I. This first electronic switch 20 which acts as a sampling switch is used to connect the first capacitor plate 12 to the input during a sampling period of the first sample and hold arrangement 4. A second electronic switch 22 is arranged in series between the first capacitor plate 12 and an output node O1. The switch 22 which can be regarded as a first output switch, is arranged to be in a high impedance condition except during an output phase when it is desired to read the sampled charge from the capacitor 10. A third electronic switch 24 is arranged in series between the second plate 14 of the capacitor 10 and a ground connection 26. This switch 24, which may be thought of as a reference switch, is low impedance at the same time that the first switch, or sampling switch, 20 is low impedance and high impedance at the same time that the sampling switch 20 is high impedance. A fourth switch 28, which can be regarded as a second output switch is provided in series between the second plate 14 of the capacitor 10 and the second plate 14 of the capacitor 10 and a second output node O2. The second output switch is arranged to be low impedance during the period that the first output switch 22 is low impedance, and in a high impedance condition during those periods that the first output switch 22 is in a high impedance state.

The sample switch 20 and the reference switch 24 of the first sample and hold block 4 are connected to a common control line, which is designated L11, where the first numeral designates the number of the sample and hold block, and the second numeral designates a number of the control line within that sample and hold block. The first and second output switches 22 and 28 are also connected to a common control line designated L12.

The second sample and hold block 6 has an identical construction to that of the first sample and hold block 4, and in conformity with the nomenclature adopted herein the control line for the sample and reference switches is designated L21, and the control line for the first and second output switches of the second sample and hold block is designated L22.

Figure 2:
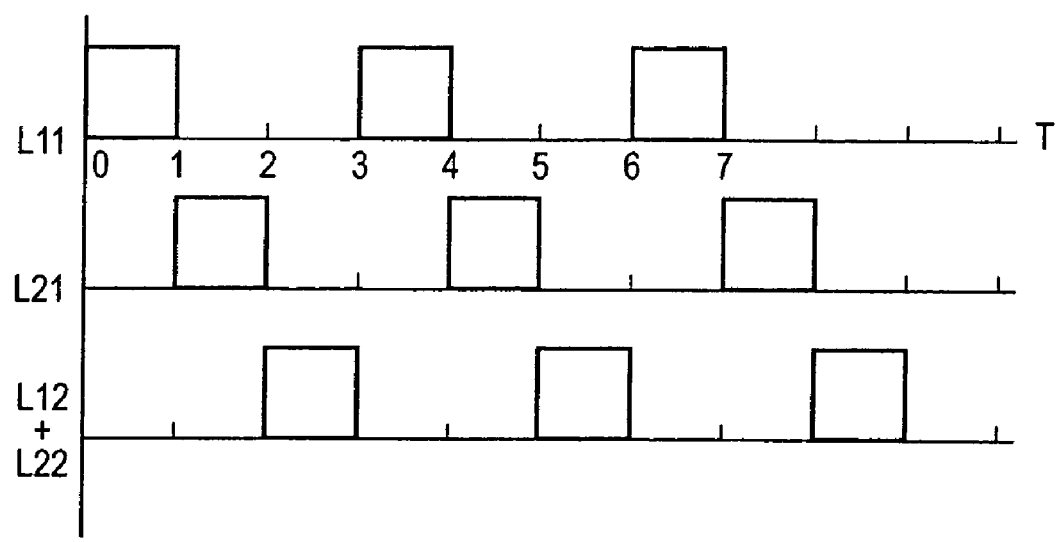
FIG. 2 shows a first timing diagram before operation of the switches shown in FIG. 1.

The operation of the circuit shown in FIG. 1 will now be described with reference to the timing diagram shown in FIG. 2. FIG. 2 shows the status of the signals on the signal lines L11, L21, L12 and L22. The signal lines L12 and L22 can be tied together in this example. During a first sampling period spanning the period time T=0 to T=1 the signal L11 is taken high thereby switching the sampling switch and reference switch 20 and 26 of the first sampling block 4 into a low impedance condition thereby effectively inserting the capacitor 10 between the input node I and the ground 26. During this period the capacitor 10 charges to a value determined either by the voltage at the input node I or by the current flowing through the node I depending on whether the designer is using the circuit to sample a voltage or a current. At time T=1 the signal L11 is returned to a low value thereby switching the sampling and reference switches of the first block 4 into a high impedance state, thereby isolating the capacitor 10 from the rest of the circuit and holding its charged state. During the time period spanning T=1 to T=2 the signal L21 is asserted thereby switching the sampling and reference switches of the second sampling block 6 into a low impedance state, so as to connect the sampling capacitor 40 of the second sampling block between the input node I and the ground 26 thereby enabling it to acquire a sample of the input signal. At time T=2 the signal L21 is cleared thereby switching the sampling reference switches of the second block 6 into a high impedance state isolating the capacitor 40 such that the charge captured thereon remains isolated. During the time period spanning T=2 to T=3 the signals L12 and L22 are asserted thereby switching the first and second output switches of each sampling block into a low impedance state so as to connect a respective capacitors, in parallel, between the output nodes O1 and O2. At this time, the voltage between the output nodes O1 and O2 represents an analog average of the samples taken by the first and second sampling blocks 4 and 6 of the input signal. In order to turn this into a single ended output, an operational amplifier 50 is provided having its non-inverting input connected to ground, its inverting input connected to the node O2, and its output connected to the node O1. Thus the parallel connected capacitors of first and second sampling blocks are placed in a feedback loop between the output and the inverting input of the operational amplifier 50 thereby causing the output voltage to assume a value proportional to the average of the charges sampled and held on the capacitors of the first and second sample and hold blocks 4 and 6. This reduces the random noise component by $\sqrt{2}$ in this example.

The circuit may also be used to reduce the effects of correlated noise or offsets from a preceding signal processing circuit, such as a chopped amplifier, where the noise in the second sampling period is substantially equal in magnitude and opposite in sign to the noise value in the first sampling period, so that the averaged value is substantially free of noise.

It will be appreciated that the circuit shown in FIG. 1 may be extended to three or more sampling blocks, further reducing the effects of random noise.

Figure 3:
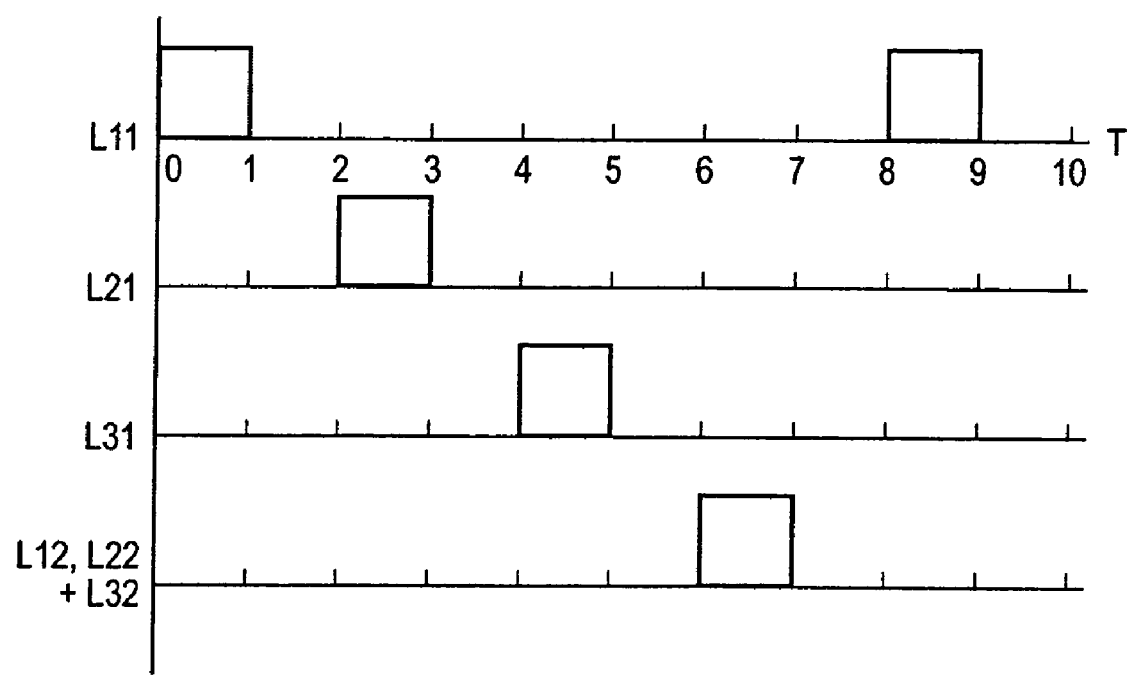
FIG. 3 shows a further timing diagram for operation of an acquisition circuit of the type shown in FIG. 1 having three sample and hold blocks.

A further mode of operation of the circuit shown in FIG. 1 will be described with reference to FIG. 3 and, for the purposes of this description it will be assumed that a third sampling block identical to the first and second sampling blocks and having signal control lines L31 and L32 is also included.

In this further mode of operation, the signal L11 is asserted during the time period spanning T=0 to T=1 in order to take a first sample of the input signal. At the time T=1 the signal L11 is cleared thereby causing the first sample and hold block to hold a sample of the input signal. At time T=2 the signal L21 is asserted thereby switching the sample and reference switches of the second sample and hold block into a low impedance condition such that it starts the sample the input signal, and at time T=3 the signal L21 is cleared again causing the second sample and hold block to hold the sample of the input signal. At time T=4 the signal L31 is asserted causing the third sample and hold block to start its sample sequence, and time T=5 the signal L31 is cleared thereby causing the third sample and hold block to hold its sample. At time T=6 the signals L12, L22 and L32 are all asserted switching on the first and second output switches of each sample and hold block thereby connecting the capacitors of the three sample and hold blocks in parallel between the output nodes O1 and O2 and consequently placing them into the feedback loop of the operational amplifier 50 such that the output of the amplifier 50 during the period spanning T=6 to T=7 is an average of the three samples acquired and held by the sample and hold blocks. The process is then repeated commencing at the time period T=8.

Figure 4:
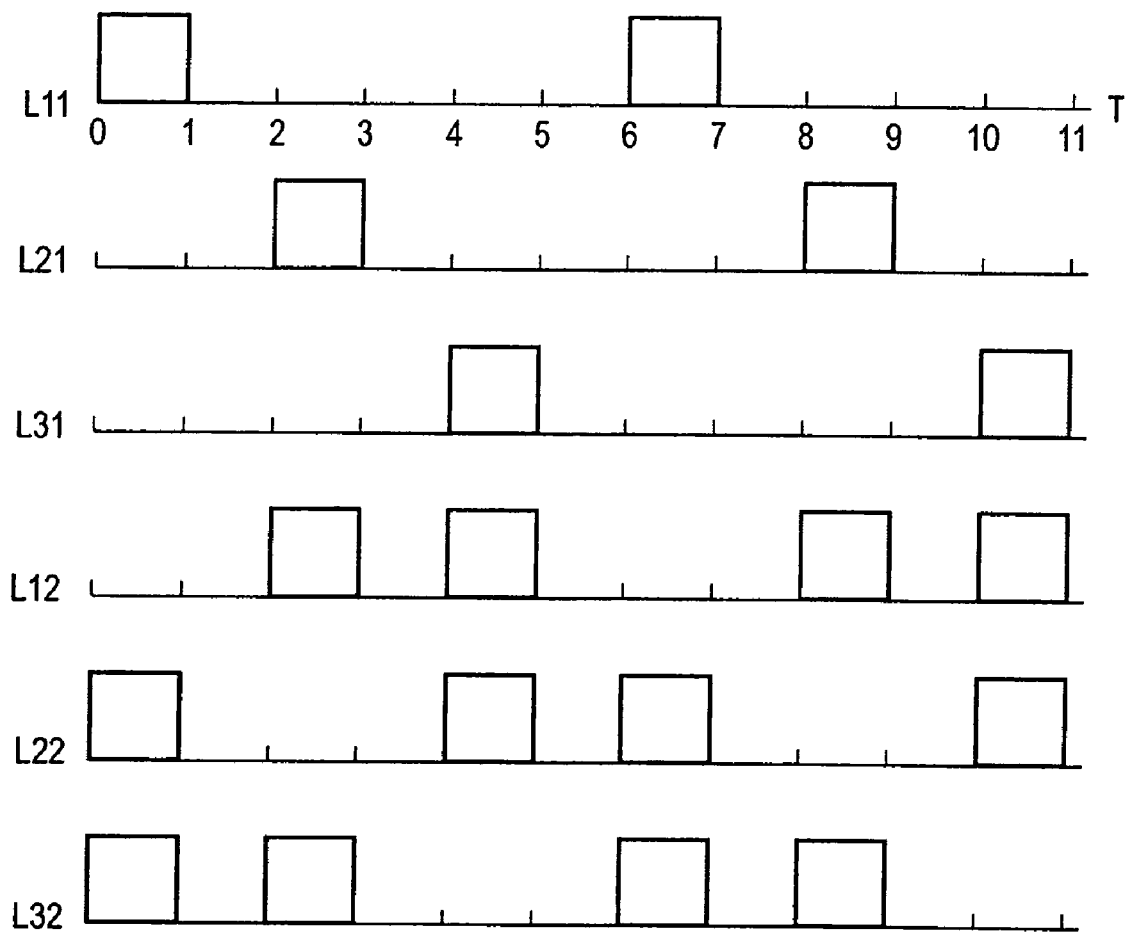
FIG. 4 shows an alternative timing diagram for operation of the switches shown in FIG. 1.

FIG. 4 shows a still further alternative way of forming the average. The process described with respect to FIG. 3 was finite in that three samples were taken, and then an average was formed. The process was then repeated. However it is also possible to form moving averages in which the most recent signal is summed with representations of the earlier signals. It can be seen, with regard to FIG. 4, that the sampling sequence remains essentially unaltered with the first sample and hold block taking its sample during the period T=0 to T=1, the second sample and hold block taking a sample during the period T=2 to T=3 and the third sample and hold block taking a sample during the period T=4 to T=5. However whilst one block is sampling the other blocks, or a subset of the other sample and hold blocks, can be in an output mode. Thus in the example shown in FIG. 4 the signals L22 and L32 are asserted during the period spanning T=0 to T=1 thereby connecting capacitors of the second and third blocks in parallel between the output nodes O1 and O2. Similarly whilst the second sampling block is sampling the signals L12 and L32 are asserted connecting the capacitors of the first and third sampling blocks in parallel between the output nodes O1 and O2. Finally, whilst the third sampling block is sampling the signals L12 and L22 are asserted thereby placing the capacitors of the first and second sample and hold blocks in parallel between the output nodes O1 and O2.

If we consider that the sampling was started at time T=0 with all the capacitors initially discharged then it becomes apparent that during the time period spanning T=2 to T=3 the charged capacitor 10 of the first sampling block is connected in parallel with the discharged capacitor of the third sampling block and hence some charge redistribution takes place between these capacitors. Thus, during the sampling period spanning time T=4 to T=5 when L12 and L22 are asserted the output is no longer an equal waiting of the most recent sample and the preceding samples but instead the preceding three samples are summed together but the most recent sample has a waiting equal to twice that of the other two samples. However, in some applications, this may well be acceptable.

Figure 5:
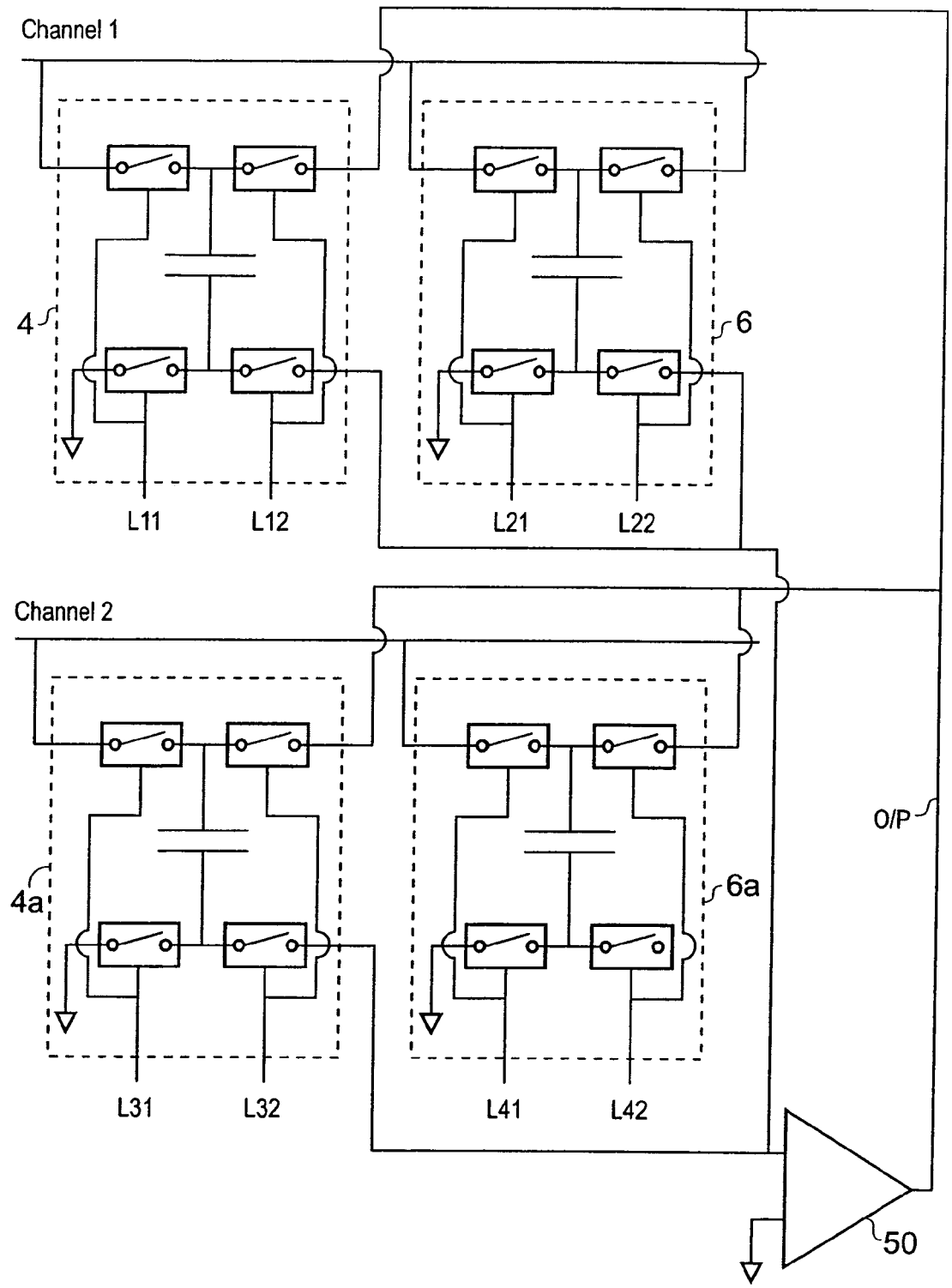
FIG. 5 is a circuit diagram of a two channel acquisition circuit arranged to acquire and average signals on a first channel and on a second channel.

FIG. 5 shows a further embodiment, similar to that shown in FIG. 1, in which the first 15 and second sampling blocks 4 and 6 co-operate to take an average of a signal applied to an input of the first channel. However an identical further circuit arrangement is formed using further blocks 4a and 6a to average a signal applied to a second channel, designated channel 2.

For this arrangement signals L11 and L31 are asserted at the same time in order to sample the input of channel 1 and channel 2 at the same time onto the sample and hold blocks 4 and 4a. After the sample has been taken the signals L11 and L31 are cleared and subsequently the signals L21 and L41 are asserted in order to sample input signals from channel 1 and channel 2 onto the sample and hold blocks 6 and 6a at the same time. Signals L21 and L41 would then be cleared. During an output phase signals L12 and L22 are asserted to connect the capacitors of the blocks 4 and 6 in parallel and into the feedback loop of the operational amplifier 50 so as to obtain a first analog average corresponding to the average of the sampled signals from channel 1. After this had been asserted for sufficiently long for the analog to digital conversion to be completed signals L12 and L22 are cleared. Subsequently signals L32 and L42 are asserted so as to connect the capacitors of the blocks 4a and 6a of the second channel in parallel into the feedback loop of the operational amplifier 50 such that the output thereof represents the average of the samples taken with the second channel. The process can then be repeated. It is clear that this can be extended to include further input channels.

Figure 6:
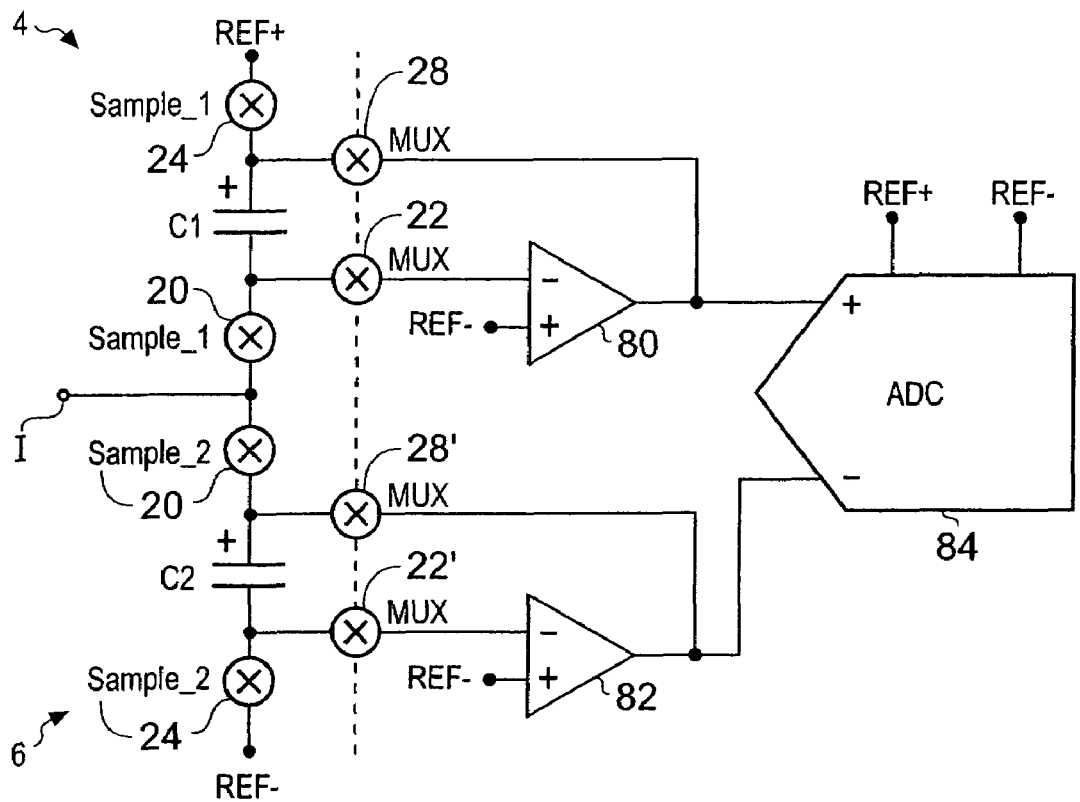
FIG. 6 is a schematic diagram of an embodiment of the present invention in which the first and second samples are summed.

In the embodiments described so far, the sampling capacitors have been connected in parallel such that charge redistribution between the capacitors forms a numerical average of the sampled signals. FIG. 6 shows a related circuit but where charge redistribution does not occur and instead the properties of a differential analog to digital converter are utilised in order to sum the sampled values. This results in an output value which is twice the average value and hence represents the simultaneous formation of an average signal and application of two times gain, all in the analog domain.

The arrangement shown in FIG. 6 has conceptual similarities with the circuit drawn in FIG. 1 and some like components are labelled with like reference numbers so as to make this apparent. The input signal line I is provided to first and second sampling circuits designated 4 and 6, respectively. The first sampling circuit has a sampling capacitor C1 (performing the same task as capacitor 10 of FIG. 1), and two sampling switches 20 and 24 arranged such that switch 20 is disposed in series connection between the input line I and one plate of the capacitor C1 and switch 24 is disposed between the other plate of the capacitor C1 and a reference node to which a reference voltage "Ref+" is applied. When it is desired to sample a signal onto capacitor C1, both switches 20 and 24 are made low impedance, but otherwise both are in a high impedance state. Two further switches 22 and 28 enable the capacitor C1 to be connected into the feedback loop of an operational amplifier 80. The operational amplifier 80 has an inverting input connectable to one plate of the capacitor C1 via switch 22, its output connectable to the other plate of capacitor C1 via the switch 28, and its non-inverting input connected to receive a reference voltage "Ref−". The second sampling circuit is similarly configured and is associated with a second operational amplifier 82. The second operational amplifier also has its non-inverting input connected to "Ref−". For the first sampling circuit the inverting input of the operational amplifier is connected to a node between capacitor C1 and the input line whereas in the second sampling circuit the inverting input of the amplifier is connected between capacitor C2 and the voltage reference "Ref−" but on the capacitor side of the switch 24' such that switch 24' can isolate the inverting input from the reference voltage "Ref−".

In use switches 20 and 24 are closed so as to sample a first voltage onto C1. Once the sample period has elapsed the switches are opened again into a high impedance state. A similar process is performed to sample a second voltage onto C2.

When it is desired to form the average switches 22, 28, 22' and 28' are closed (go low impedance) whilst the switches 20, 24, 20' and 24 are opened.

Assuming that the sampled voltage during the first period was $V_1$ and the sampled voltage during the second period was $V_2$. The operation of the circuit is such that it forms an output having a value of $V_1+V_2$. This is demonstrated with a worked example. Suppose "Ref+" is +5v, "Ref−" is −5v and we have two input samples of 1v.

We see that C1 charges to +4v whereas C2 charges to +6v. The voltage of the inverting input of amplifier 80 will be −5 volts (due to the way op-amps work to reduce the difference between their inputs to zero), to achieve an output of −1v.

For the op-amp 82, it also tries to set its inverting input to −5 volts, and hence the output of the amplifier will be +1v (6 volts being dropped across C2). Therefore the non-inverting input of the ADC 84 sees −1v and the inverting input sees +1v. Therefore the ADC sees a 2 volt input signal. Ref+ and Ref− do not need to be symmetrically disposed around 0V.

Figure 7:
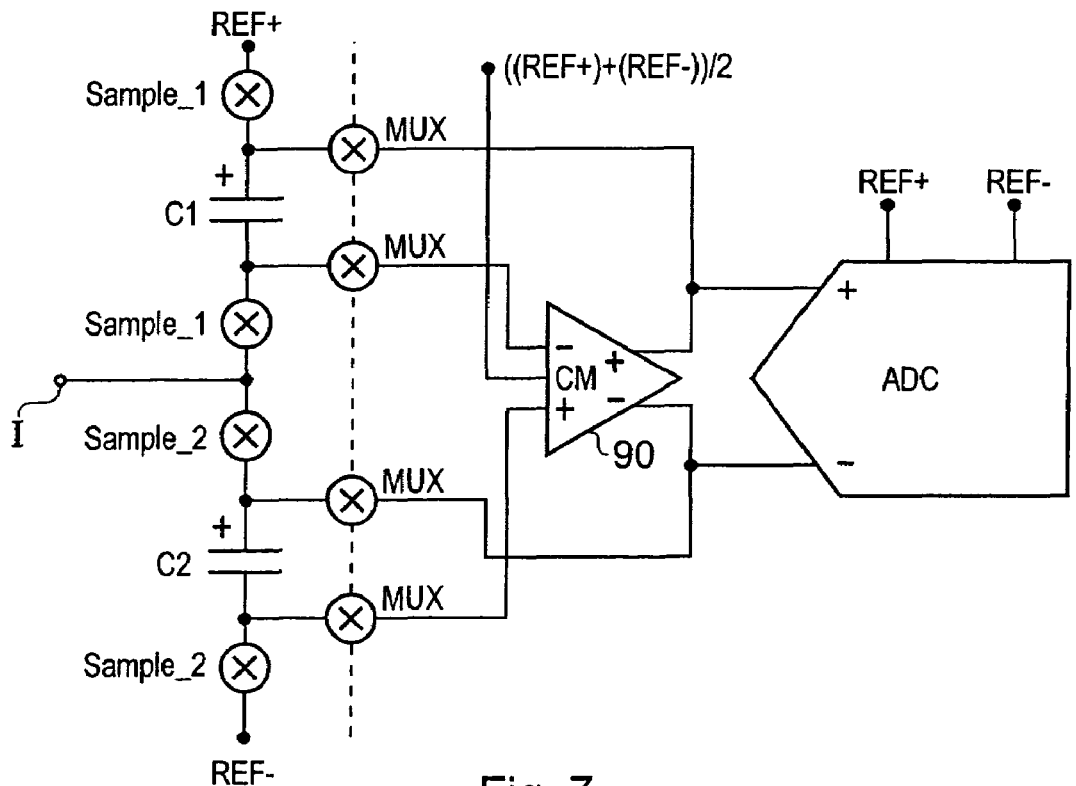
FIG. 7 shows an alternative configuration to that shown in FIG. 6.

FIG. 7 shows essentially the same circuit, but implemented using a single operational amplifier 90 having a differential input and a differential output.

Figure 8:
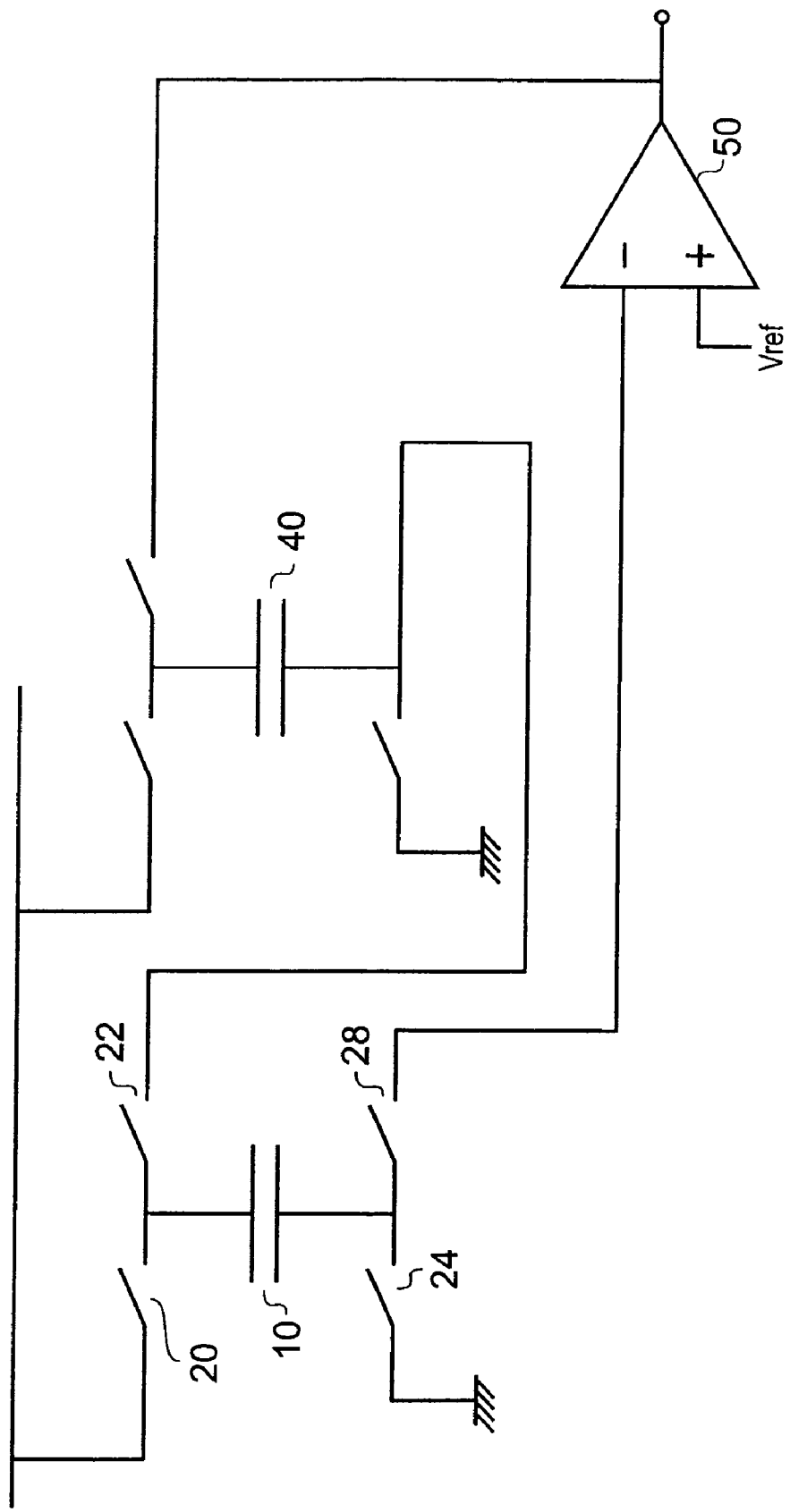
FIG. 8 shows a summing configuration using a single ended circuit.

FIG. 8 shows a further arrangement based on FIG. 1 but where the internal connections have been reconfigured such that operation of the switches 22, 22' and 28 cause the sampling capacitors 10 and 40 to be placed in a series connection within the feedback loop of the buffer amplifier 50.

In FIGS. 6, 7 and 8 the control lines for the switches have been omitted for clarity.

It is thus possible to provide an effective and yet inexpensive acquisition arrangement which allows signal averaging to be done in the analog domain, thereby reducing the conversion speed requirements placed upon an analog to digital converter. It is clear that, although the sample times and the output times have been described herein as being of the same duration, this is not necessarily the case and the designer can choose to shorten or lengthen the output time with respect to the sample time depending upon their own requirements. Thus the output time could be further increased in order to further reduce the performance requirements of the analog to digital converter.

The invention claimed is:

1. A sample and hold apparatus comprising:
    a first sampling arrangement arranged to sample a first input signal during a first sampling period, and to hold a first sample of the first input signal after completion of the first sampling period;
    a second sampling arrangement arranged to sample the first input signal during a second sampling period, and to hold a second sample of the first input signal after completion of the second sampling period;
    each sampling arrangement comprising a capacitor for sampling the first input signal, a sampling switch for connecting a first plate of the capacitor to an input, a first output switch for connecting the first plate of the capacitor to a first output node, and a reference switch for connecting a second plate of the capacitor to a reference node;
    and wherein the first and second sampling arrangements are further arranged to output the first and second samples to a combining arrangement during a first output period.

2. A sample and hold apparatus comprising:
a first sampling arrangement arranged to sample a first input signal during a first sampling period, and to hold a first sample of the first input signal after completion of the first sampling period;
a second sampling arrangement arranged to sample the first input signal during a second sampling period, different from the first sample period, and to hold a second sample of the first input signal after completion of the second sampling period;
and wherein the first and second sampling arrangements are further arranged to output the first and second samples to a combining arrangement during a first output period, and wherein each sampling arrangement comprises a capacitor for sampling the first input signal, a sampling switch for connecting a first plate of the capacitor to an input, and a first output switch for connecting the first plate of the capacitor to a first output node, a reference switch for connecting a second plate of the capacitor to a reference node and a second output switch for connecting the second plate of the capacitor to a second output node.

3. A sample and hold apparatus as claimed in claim 2 in which, during the first output period the capacitors of the first and second sampling arrangements are connected in parallel.

4. A sample and hold apparatus as claimed in claim 2 or claim 1, in which the combining arrangement is an averaging arrangement comprising a differential amplifier having an inverting input, a non-inverting input and an output, and during the first output period the first and second output switches of each of the first and second sampling arrangements connect the capacitors in parallel between the output and the inverting input of the averaging device.

5. A sample and hold circuit as claimed in claim 2 in which, during the first sampling period only the capacitor of the first sampling arrangement is connected to the first input signal.

6. A sample and hold circuit as claimed in claim 2 in which, during the second sampling period only the capacitor of the second sampling arrangement is connected to the first input signal.

7. A sample and hold apparatus as claimed in claim 2, comprising at least one further sampling arrangement for sampling the first input signal during a respective sampling period.

8. A sample and hold apparatus as claimed in claim 2, comprising a plurality of channels for sampling a plurality of input signals.

9. A sample and hold apparatus as claimed in claim 2, wherein the combining arrangement is arranged to form a sum of the first and second samples.

10. A sample and hold arrangement as claimed in claim 9, wherein the combining arrangement provides versions of the first and second samples to inputs of a differential device.

11. A sample and hold arrangement as claimed in claim 2 or claim 1, wherein during the first sampling period the capacitor of the first sampling arrangement is connected to a first reference node having a first reference voltage and during the second sampling period the capacitor of the second sampling arrangement is connected to a second reference node having a second reference voltage.

12. A sample and hold arrangement as claimed in claim 11 in which the second reference voltage is different to the first reference voltage.

13. A sample and hold arrangement as claimed in claim 11 in which during the first output period the capacitor of the first sampling arrangement is placed in the feedback loop of a first operational amplifier, and the capacitor of the second sampling arrangement is placed in the feedback loop of a second operational amplifier.

14. A sample and hold arrangement as claimed in claim 13, in which reference voltages provided to non-inverting inputs of the amplifiers are the same.

15. A sample and hold apparatus comprising:
a first sampling arrangement arranged to sample a first input signal during a first sampling period, and to hold a first sample of the first input signal after completion of the first sampling period;
a second sampling arrangement arranged to sample the first input signal during a second sampling period, different from the first sample period and to hold a second sample of the first input signal after completion of the second sampling period;
and wherein the first and second sampling arrangements are further arranged to output the first and second samples to a combining arrangement during a first output period, the sample and hold apparatus further including third and fourth sampling arrangements and arranged to sample a differential input signal.

16. A sample and hold comprising:
a first sampling arrangement arranged to sample a first input signal during a first sampling period, and to hold a first sample of the first input signal after completion of the first sampling period;
a second sampling arrangement arranged to sample the first input signal during a second sampling period, different from the first sample period and to hold a second sample of the first input signal after completion of the second sampling period;
wherein the first and second sampling arrangements are further arranged to output the first and second samples to a combing arrangement during a first output period; and
wherein the combining arrangement is adapted to form a sum of the first and second samples by providing versions of the first and second samples to inputs of a differential analog to digital converter.

17. A sample and hold apparatus comprising:
a first sampling arrangement arranged to sample a first input signal during a first sampling period, and to hold a first sample of the first input signal after completion of the first sampling period;
a second sampling arrangement arranged to sample the first input signal during a second sampling period, and to hold a second sample of the first input signal after completion of the second sampling period;
each sampling arrangement comprising a capacitor for sampling the first input signal, a sampling switch for connecting a first plate of the capacitor to an input, and a first output switch for connecting the first plate of the capacitor to a first output node;
and wherein the first and second sampling arrangements are further arranged to output the first and second samples to a combining arrangement during a first output period, during which the first output period the capacitors of the first and second sampling arrangements are connected in parallel.

* * * * *

UNITED STATES PATENT AND TRADEMARK OFFICE
CERTIFICATE OF CORRECTION

PATENT NO. : 7,113,116 B2
APPLICATION NO. : 11/045672
DATED : September 26, 2006
INVENTOR(S) : Robert John Brewer et al.

It is certified that error appears in the above-identified patent and that said Letters Patent is hereby corrected as shown below:

Col. 3, line 57, "before" should be --for--

Col. 4, line 45, delete "the second plate of the capacitor 10 and"

Col. 5, line 6, "26" should be --24--

Col. 5, line 24, after "sampling" insert --and--

Col. 6, line 3, "the sample" should be --sampling--

Col. 8, line 6, "24" should be --24'--

In Claim 5, Col. 9, line 35, "circuit" should be --apparatus--

In Claim 6, Col. 9, line 39, "circuit" should be --apparatus--

In Claim 10, Col. 9, line 53, "arrangement" should be --apparatus--

In Claim 12, Col. 9, line 63, "arrangement" should be --apparatus--

In Claim 13, Col. 10, line 1, "arrangement" should be --apparatus--

In Claim 14, Col. 10, line 7, "arrangement" should be --apparatus--

Signed and Sealed this

Twenty-seventh Day of November, 2007

JON W. DUDAS
*Director of the United States Patent and Trademark Office*